(12) United States Patent
Masuda et al.

(10) Patent No.: US 6,772,185 B1
(45) Date of Patent: Aug. 3, 2004

(54) TIME-SERIES PREDICTING METHOD USING WAVELET NUMBER SERIES AND DEVICE THEREOF

(75) Inventors: Naoki Masuda, Tokyo (JP); Kazuyuki Aihara, Narashino (JP)

(73) Assignee: Japan Science and Technology Corporation (JP)

( * ) Notice: Subject to any disclaimer, the term of this patent is extended or adjusted under 35 U.S.C. 154(b) by 446 days.

(21) Appl. No.: 09/744,912
(22) PCT Filed: Jun. 1, 2000
(86) PCT No.: PCT/JP00/03545
  § 371 (c)(1),
  (2), (4) Date: Apr. 12, 2001
(87) PCT Pub. No.: WO00/76074
  PCT Pub. Date: Dec. 14, 2000

(30) Foreign Application Priority Data

Jun. 2, 1999 (JP) .......................................... 11/154458

(51) Int. Cl.[7] .............................................. G06F 17/14
(52) U.S. Cl. ...................................... 708/530; 714/746
(58) Field of Search ......................... 708/530; 714/746, 714/747

(56) References Cited

U.S. PATENT DOCUMENTS 5,420,872 A * 5/1995 Hyodo et al. ................ 714/747
6,295,624 B1 * 9/2001 Gillard ........................ 714/746

* cited by examiner

*Primary Examiner*—David H. Malzahn
(74) *Attorney, Agent, or Firm*—Lorusso, Loud & Kelly

(57) ABSTRACT

An object is to provide a time-series prediction method and apparatus utilizing wavelet coefficient series which can accurately predict a prediction value of an original time series.

When a time-series prediction utilizing wavelet coefficient series is performed, a time series is wavelet-transformed by use of a wavelet transformation unit in order to decompose the time series into a plurality of time series which are band-restricted in the frequency domain, predicted values of frequency components obtained as a result of decomposition are predicted by use of corresponding prediction units, and the prediction values of the respective frequency components are reconstructed by use of an inverse wavelet transformation unit to thereby obtain a prediction value of the original time series.

6 Claims, 4 Drawing Sheets

TIME-SERIES PREDICTING METHOD USING WAVELET NUMBER SERIES AND DEVICE THEREOF

TECHNICAL FIELD

The present invention relates to a time-series prediction method and apparatus utilizing wavelet coefficient series.

BACKGROUND ART

Conventionally, time-series prediction has been performed in solely the time domain or in solely the frequency domain. Time-domain prediction is performed as shown in FIG. 1, and many models, such as a linear regression model, pertain to time-domain prediction. Frequency-domain prediction is performed as shown in FIG. 2, and a model for inferring the shape of a power spectrum pertains to frequency-domain prediction. These traditional methods have been studied widely and applied to actual time-series prediction.

DISCLOSURE OF THE INVENTION

However, in the above-described conventional methods, prediction accuracy decreases for a time series having a certain time configuration in solely a specific frequency band or for a composite time series having a different time configuration in each of different frequency bands. This is because prediction in solely the time domain or in solely the frequency domain cannot simultaneously handle information in the time domain and information in the frequency domain.

Incidentally, when a time series is subjected to wavelet expansion, the time series is represented in the form of the sum of frequency components localized in the time domain.

In view of the foregoing, an object of the present invention is to provide a time-series prediction method and apparatus utilizing wavelet coefficient series which can obtain a prediction value of an original time series through an operation of wavelet-transforming the time series to thereby decompose the time series into a plurality of time series which are band-restricted in the frequency domain, and then inversely transforming the individual prediction values of the plurality of time series of the respective frequency components.

To achieve the above object, the present invention provides the following.

[1] A time-series prediction method utilizing wavelet coefficient series comprising: (a) wavelet-transforming a time series by use of a wavelet transformation unit in order to decompose the time series into a plurality of time series which are band-restricted in the frequency domain; (b) predicting values of frequency components obtained as a result of decomposition, by use of corresponding prediction units; and (c) reconstructing the prediction values of the respective frequency components by use of an inverse wavelet transformation unit to thereby obtain a prediction value of the original time series.

[2] A time-series prediction method utilizing wavelet coefficient series as described in [1] above, characterized in that ordinary wavelet transformation is used in order to wavelet-transform the time series to thereby univocally decompose the time series into a plurality of time series of the respective frequency components.

[3] A time-series prediction method utilizing wavelet coefficient series as described in [1] above, characterized in that stationary wavelet transformation is used for decomposition of the time series in order to observe the frequency components of the time series while aligning their observation times.

[4] A time-series prediction apparatus utilizing wavelet coefficient series, comprising: (a) a wavelet transformation unit for decomposing a time series into a plurality of coefficient series of different frequency components; (b) prediction units for predicting values of the respective frequency components; and (c) an inverse wavelet transformation unit for reconstructing the prediction values of the respective frequency components to thereby obtain a prediction value of the original time series.

BEST MODE FOR CARRYING OUT THE INVENTION

An embodiment of the present invention will next be described in detail with reference to the drawings.

Figure 4:
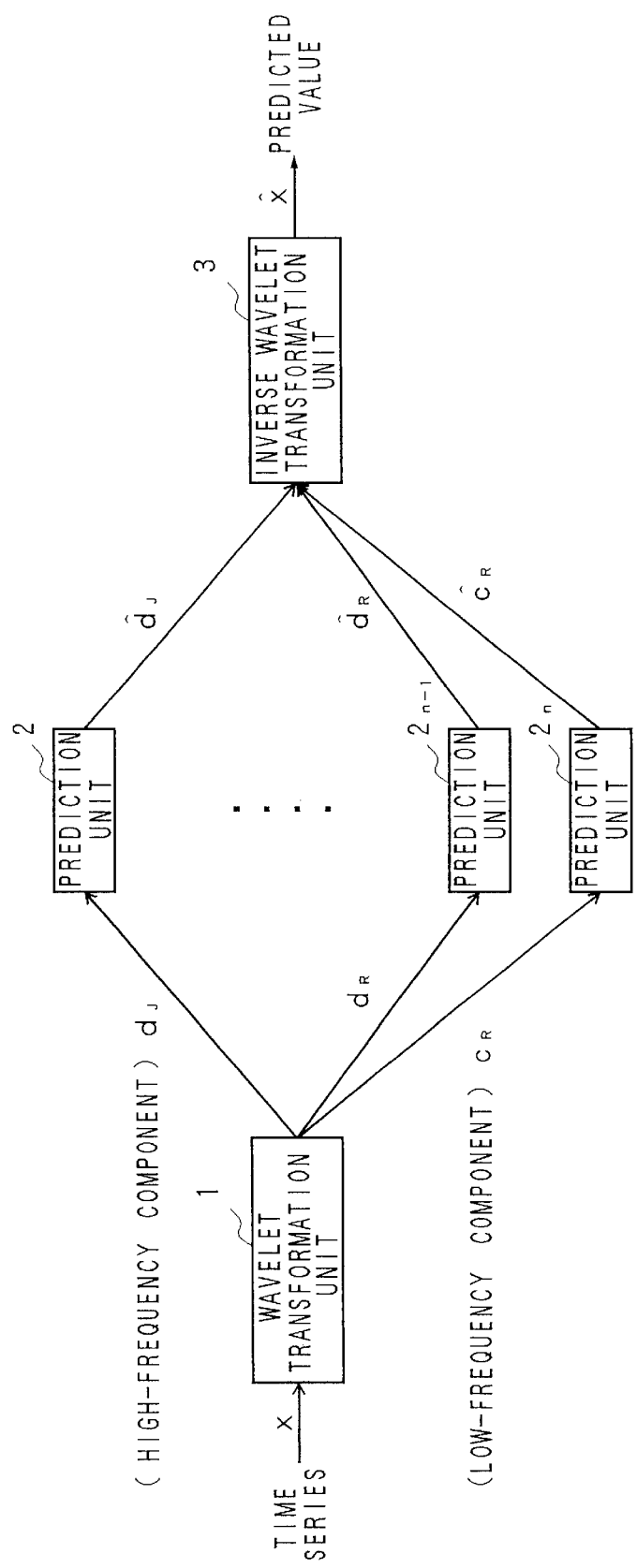
FIG. 4 is a block diagram showing the configuration of a time-series prediction system utilizing wavelet coefficient series according to an embodiment of the present invention.

FIG. 4 is a block diagram showing the configuration of a time-series prediction system utilizing wavelet coefficient series according to an embodiment of the present invention.

In FIG. 4, reference numeral 1 denotes a wavelet transformation unit; $2_1, \ldots, 2_{n-1}$, and $2_n$ denote prediction units for different frequency components; and 3 denotes an inverse wavelet transformation unit.

First, the wavelet transformation unit 1 decomposes a time series x into a plurality of frequency components. Subsequently, the prediction units $2_1, \ldots, 2_{n-1}$, and $2_n$ calculate prediction values of the respective frequency components. The inverse wavelet transformation unit 3 performs inverse wavelet transformation for the thus-obtained prediction values of the respective frequency components, in order to obtain a prediction value of the original time series.

As described above, the input time series is decomposed into a plurality of frequency components by the wavelet transformation unit 1. In FIG. 4, the frequency components are shown in order of frequency such that the frequency component of highest frequency is shown at the uppermost position and the frequency component of lowest frequency is shown at the lowermost position. A prediction value of each frequency component is predicted by the corresponding prediction unit $2_1, \ldots, 2_{n-1}$, or $2_n$. The thus-obtained prediction values of the respective frequency components are subjected to inverse wavelet transformation performed by the inverse wavelet transformation unit 3. Thus, a prediction value of the original time series is constructed.

Notably, ordinary wavelet transformation (WT) and stationary wavelet transformation (SWT) can be used in the wavelet transformation unit 1 and the inverse wavelet transformation unit 3.

Prediction can be performed for all types of time series through changing the prediction units $2_1, \ldots, 2_{n-1}$, and $2_n$ according to the properties of a time series to be predicted. A deterministic prediction model such as a locally linear model is used for deterministic time series, and a stochastic prediction model such as an AR model is used for stochastic processes.

Next will be described decomposition of a time series by use of two types of wavelet transformations, as well as a specific prediction scheme.

Here, there will be described a method for wavelet-transforming a time series in order to univocally decompose the time series into a plurality of time series of the respective frequency components. Further, there will be described stationary wavelet transformation which is necessary for observing frequency components of a time series while aligning their observation times.

[1] Wavelet Transformation

When $\Psi_{j,k}(t) = 2^{j/2}\Psi(2^j t - k)$ for an orthogonal wavelet $\Psi(t)$, a certain $\{\phi_{R,k}(t) | k \in Z\}$, $\phi_{R,k}(t) = 2^{R/2}\phi(2^R t - k)$ is present, and $f(t) \in L^2(R)$ is univocally wavelet-transformed (hereinafter referred to as "WT").

$$f(t) = \sum_{j \geq R, k} d_j(k)\phi_{j,k}(t) + \sum_k c_R(k)\phi_{R,k}(t) \quad (1)$$

$$d_j(k) = <f(t), \phi_{j,k}(t)> \quad (j \geq R)$$

$$c_R(k) = <f(t), \phi_{R,k}(t)>$$

Here, $<f_1, f_2>$ represent inner products of $f_1$ and $f_2$ in $L^2(R)$. $d_j(k)$ whose j is large represents a high-frequency component, and $C_R(k)$ represents a low-frequency component.

When a discrete time series $\chi = \{x(n)\}$ is transformed, first, f(t) obtained through projecting $\{x(n)\}$ on a subspace spanned by $\{\phi_{J,k}(t) | k \in Z\}$ is transformed by use of the above-described formula (1) as follows:

$$f(t) = \sum_{R \leq j < l, k} d_j(k)\phi_{j,k}(t) + \sum_k c_R(k)\phi_{R,k}(t) \quad (1)'$$

Figure 5:
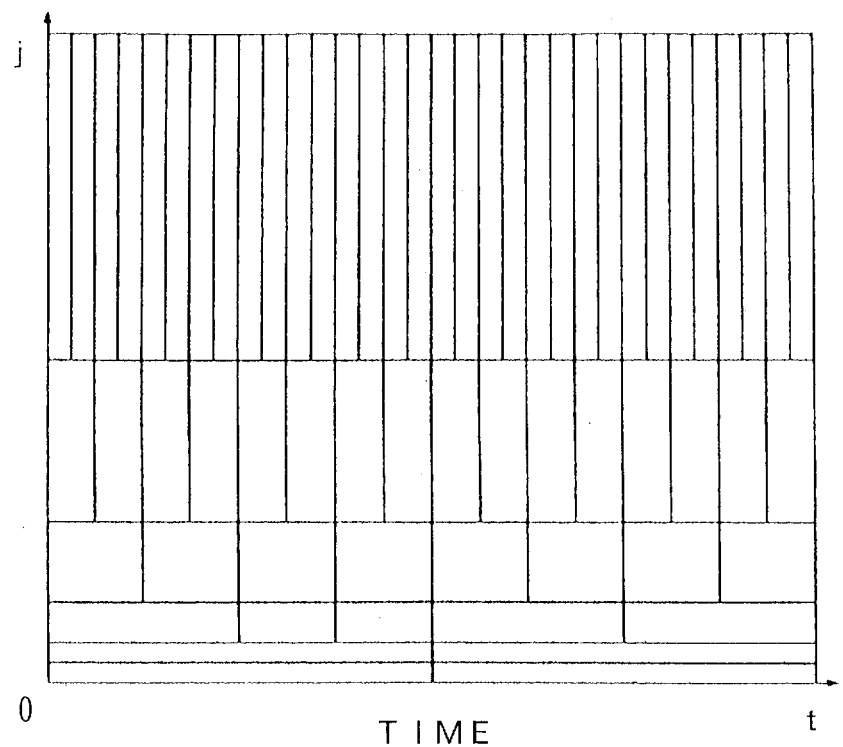
FIG. 5 is a diagram showing sampling of time-frequency components by means of wavelet transformation (WT) performed in the embodiment of the present invention.

With regard to a discrete time series of finite length, the time series is expanded by use of periodic boundary conditions. Thus, the above-described transformation can be justified to be a transformation in $L^2(R)$. However, the length of the time series must be $2^J (J \in N)$. In this case, correspondence between the original time series and frequency components is represented by the following formula (2), and, ideally, the respective wavelet coefficients correspond to sampling values of time-frequency components by WT shown in FIG. 5.

$$x = [x(1), \ldots, x(2^J)] \Leftrightarrow \begin{cases} d_{J-1} = [d_{J-1}(1), \ldots, d_{J-1}(2^{J-1})] \\ d_{J-2} = [d_{J-2}(1), \ldots, d_{J-2}(2^{J-2})] \\ \vdots \\ d_R = [d_R(1), \ldots, d_R(2^R)] \\ c_R = [c_R(1), \ldots, c_R(2^R)] \end{cases} \quad (2)$$

[2] Stationary Wavelet Transformation

In order to observe all frequency components of a discrete time series at a certain time, the sampling interval of $d_j$ must be made the same for all values of j. First, f(t) is obtained through projection, and stationary wavelet transformation (hereinafter referred to as SWT) of the following formula (3) is performed.

$$d'_j(k) = <f(t), 2^{j/2}\phi[2^j(t - 2^{-J}k)]>, (R \leq j < J)$$

$$c'_R(k) = <f(t), 2^{R/2}\phi[2^R(t - 2^{-J}k)]> \quad (3)$$

Figure 6:
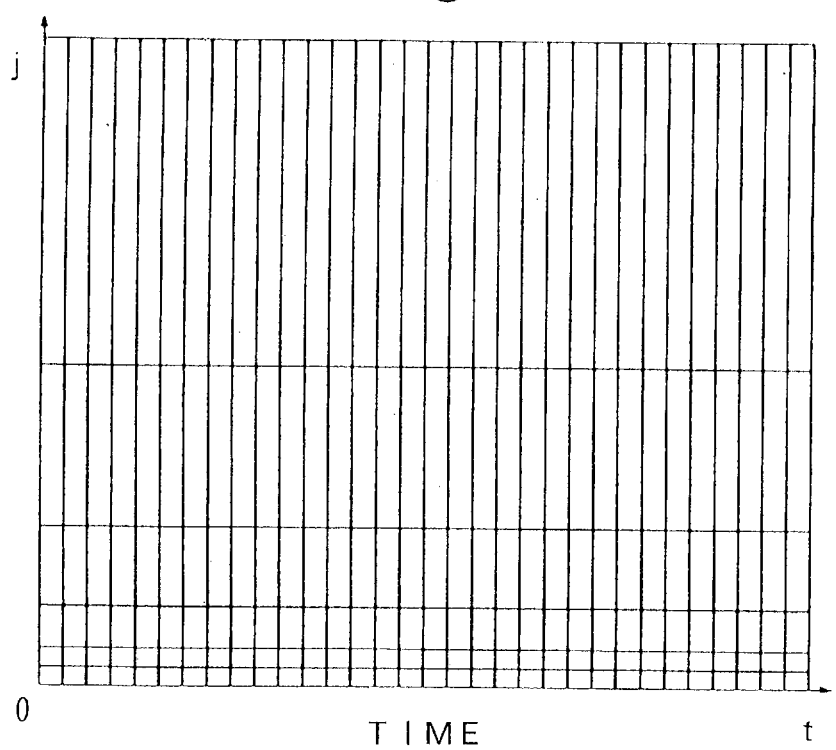
FIG. 6 is a diagram showing sampling of time-frequency components by means of stationary wavelet transformation (SWT) performed in the embodiment of the present invention.

FIG. 6 shows sampling of SWT in time/frequency domain.

The following relation holds between the coefficients of SWT and those of WT:

$$d'_j(2^{J-j}k) = d_j(k), \; c'_R(2^{J-R}k) = c_R(k) (R \leq j < J) \quad (4)$$

$d'_j(k)$ and $c'_R(k)$, which do not appear in the above-described formula (4), are redundant.

As in the case of WT, for a time series of length $2^J$, the following correspondence holds:

$$x = [x(1), \ldots, x(2^J)] \Leftrightarrow \begin{cases} d'_{J-1} = [d'_{J-1}(1), \ldots, d'_{J-1}(2^J)] \\ d'_{J-2} = [d'_{J-2}(1), \ldots, d'_{J-2}(2^J)] \\ \vdots \\ d'_R = [d'_R(1), \ldots, d'_R(2^J)] \\ c'_R = [c'_R(1), \ldots, c'_R(2^J)] \end{cases} \quad (5)$$

In order to perform inverse transformation of SWT of formula (5), required $d_j(k)$ and $c_R(k)$ are picked up from the above-described formula (4) and are subjected to inverse wavelet transformation.

[3] Time-Series Prediction Scheme for the Cases of WT and SWT

A specific prediction scheme will be described for the case in which WT is used in the prediction system of FIG. 4 and for the case in which SWT is used in the prediction system of FIG. 4. The original time series x is assumed to have a length of $2^J$.

① Prediction by WT (1) Through WT of x, respective frequency components $d_{J-1}, d_{J-2}, \ldots, d_R, c_R$ are obtained.

(2) For the respective frequency components, prediction is performed for $2^{j-R}p$ steps ahead of the present. A prediction value of $d_j(2^j)$ for $i^{th}$ step is written as $\hat{d}_j(2^j + i)$.

(3) Inverse wavelet transformation is performed for the following:

$$\begin{cases} [d_{J-1}(2^{J-1-R}p+1), \ldots, d_{J-1}(2^{J-1}), & (6) \\ \tilde{d}_{J-1}(2^{J-1}+1), \ldots, \tilde{d}_{J-1}(2^{J-1}+2^{J-1-R}p)] \\ \vdots \\ [d_R(p+1), \ldots, d_R(2^R), \tilde{d}_R(2^R+1), \ldots, \tilde{d}_R(2^R+p)] \\ [c_R(p+1), \ldots, c_R(2^R), \tilde{c}_R(2^R+1), \ldots, \tilde{c}_R(2^R+p)] \end{cases}$$

Thus, $[\hat{x}(2^{J-R}p+1), \hat{x}(p+2), \ldots, \hat{x}(2^J+2^{J-R}p)]$ is obtained, and prediction values $\hat{x}(2^J+1), \ldots \hat{x}(2^J+2^{J-R}p)$ is obtained therefrom.

② Prediction by SWT (1) Through SWT of $\chi$, respective frequency components $d'_{J-1}, d'_{J-2} \ldots, d'_R, c'_R$ of length $2^J$ are obtained.

(2) For the respective frequency components, prediction is performed for p steps ahead of the present. A prediction value of $d'_j(2^J)$ for $i^{th}$ step is written as $d'_j(2^J+i)$.

(3) Inverse wavelet transformation is performed for the following $$\begin{cases} [d'_{J-1}(p+1), \ldots, d'_{J-1}(2^J), \tilde{d}'_{J-1}(2^J+1), \ldots, \tilde{d}'_{J-1}(2^J+p)] & (7) \\ \vdots \\ [d'_R(p+1), \ldots, d'_R(2^J), \tilde{d}'_R(2^J+1), \ldots, \tilde{d}'_R(2^J+p)] \\ [c'_R(p+1), \ldots, c'_R(2^J), \tilde{c}'_R(2^J+1), \ldots, \tilde{c}'_R(2^J+p)] \end{cases}$$

Thus, $[\hat{x}(p+1), \hat{x}(p+2), \ldots, \hat{x}(2^J+p)]$ is obtained, and prediction values $\hat{x}(2^J+1), \ldots \hat{x}(2^J+p)$ is obtained therefrom.

[4] Prediction of Chaotic Time Series Will Be Described

Effectiveness of the time-series prediction system utilizing wavelet coefficient series according to the present invention will be described, while prediction of chaotic time series are taken as examples.

(1) Case in which a deterministic low-frequency variation is accompanied with high-frequency chaotic noise When an original dynamical system is the sum of a deterministic chaotic dynamical system constituting a high-frequency component and a deterministic chaotic dynamical system constituting a low-frequency component, each frequency component is controlled only by the corresponding dynamical system, so that prediction up to a certain point in time can be performed accurately. Therefore, prediction for the original time series can be performed at relatively high accuracy. Meanwhile, when direct prediction is performed in the time domain, the high-frequency noise component deteriorates accuracy of prediction for the low-frequency component, and the error increases exponentially. Therefore, satisfactory prediction cannot be performed.

[Example A]

Effectiveness of the time-series prediction system utilizing wavelet coefficient series according to the present invention will be shown through simulation.

Here, a time series z(n), which is obtained through normalized $x_n$ of the Ikeda map such that the average is zero, is added to a y(n), which is a discrete time observation value of the x coordinate of the Rossler equations, to obtain a time series [x(n)], and prediction is performed for the time series [x(n)]. y(n) represents a low-frequency component, and z(n) represents high-frequency noise. When the variance of the time series is represented by σ, σ[y(n)]=6.374 and σ[z(n)]=0.640. The length of $\chi$ is $N=2^J=8192$.

Figure 7:
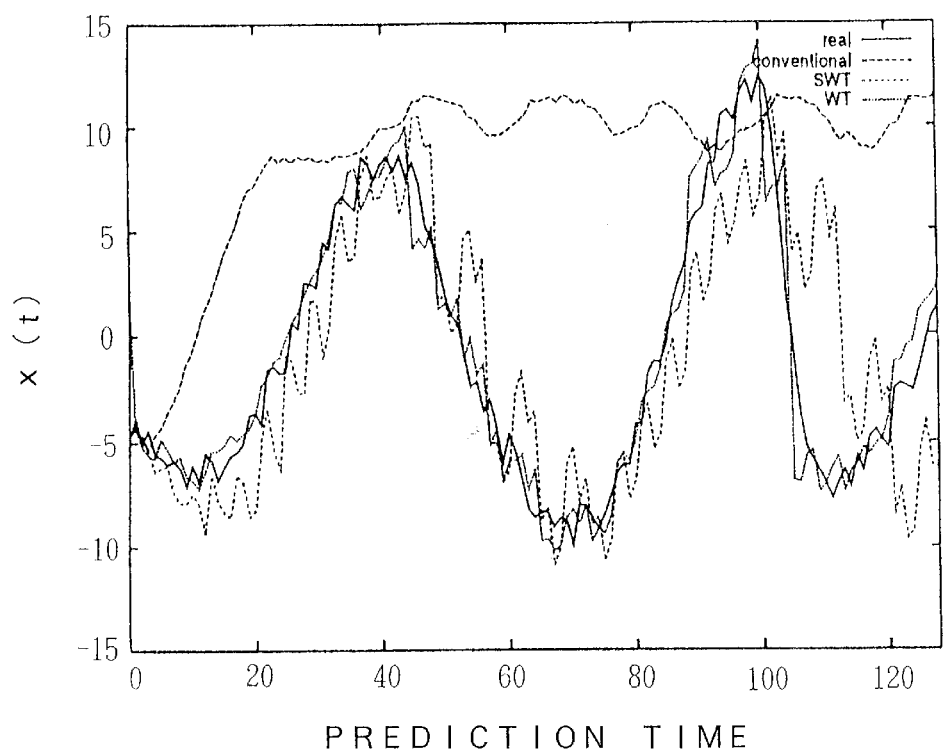
FIG. 7 is a first graph showing the relation between prediction time and prediction result obtained in the embodiment of the present invention.

Prediction was performed for $\chi$ up to a point in time where M=128, by use of WT and SWT. R was set to 10 in both the prediction by WT and the prediction by SWT. FIG. 7 shows prediction results. Piecewise linear mapping is used for the prediction.

Both the prediction by WT and the prediction by SWT provide accuracy higher than that of time-domain direct prediction, in both a short period and a long period. Whereas the direct prediction becomes unable to provide effective prediction after a few steps, the method utilizing wavelets can predict the low-frequency component ($Д'_{10}$, etc.) controlled by [y(n)], so that the overall prediction accuracy is improved. Since excessive interpolation deteriorates the prediction accuracy, WT provides higher accuracy for long-term prediction than does SWT.

(2) Case in which a deterministic low-frequency variation is accompanied with white noise Next will be shown that the time-series prediction system utilizing wavelet is effective even in the case in which a deterministic low-frequency variation is accompanied with white noise.

The accuracy of time-domain direct prediction is not satisfactory even in short term prediction, due to influence of white noise. However, since the S/N ratio is high at low frequency, prediction utilizing wavelets enables stable prediction of low-frequency variation over a long time.

[Example B]

Figure 1:
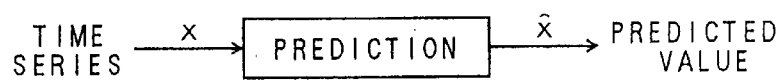
FIG. 1 is a block diagram showing a conventional method for time-domain prediction.
Figure 2:
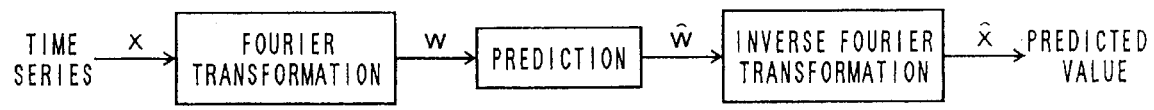
FIG. 2 is a block diagram showing a conventional method for frequency-domain prediction.
Figure 3:
FIG. 3 is a block diagram showing a method for performing prediction after a time series is passed through a low-pass filter.
Figure 8:
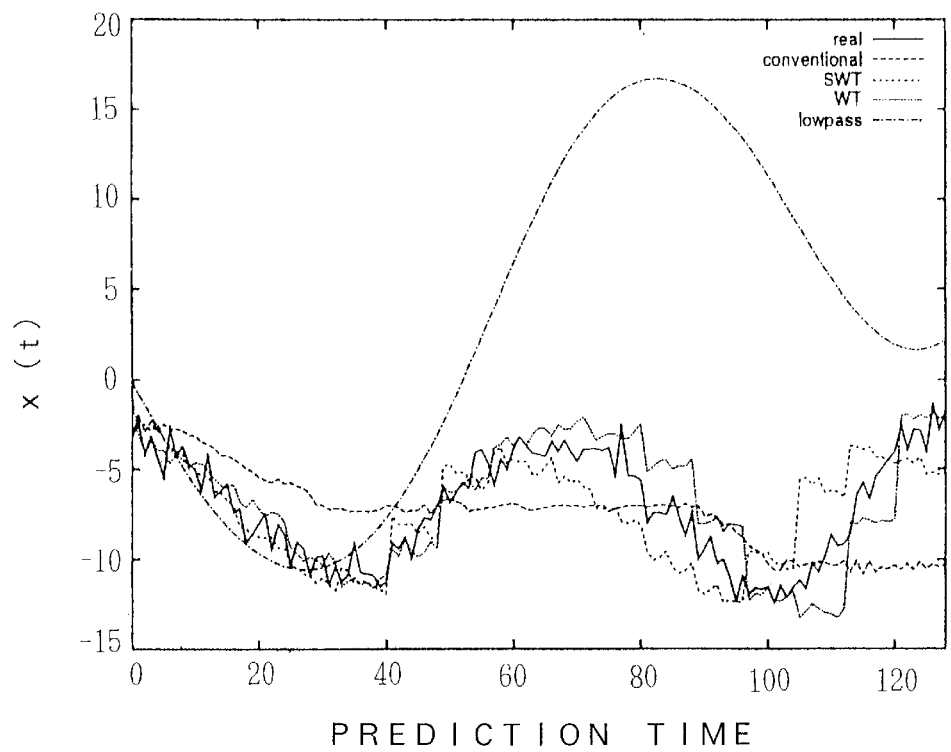
FIG. 8 is a second graph showing the relation between prediction time and prediction result obtained in the embodiment of the present invention.

Here, a discrete time observation value of the x component of the Lorenz equations is used as a low-frequency component y(n); white noise is used as a high-frequency component z(n); and x=[x(n)]=[y(n)+z(n)] is used as a time series under observation. σ[y(n)]=8.242 and σ[z(n)]=0.700. The length of the time series is $N=2^J=8192$. In accordance with the same method as used in the above-described example A, prediction of x was performed for 128 periods. FIG. 8 shows the result of the prediction. For comparison, FIG. 8 further shows the result of prediction performed by a method in which prediction is performed after removal of the high-frequency component by use of a low-pass filter (see FIG. 3).

Direct prediction fails to perform even short-term prediction. The method in which prediction is performed after the time series is passed through a low-pass filter provides a prediction accuracy equal to that of other methods within about 30 steps. However, the prediction utilizing wavelets provides a higher prediction accuracy in subsequent steps. Since the method utilizing wavelets can properly approximate a local function of the low-frequency component, stable prediction over a long time can be performed.

As described above, in the present invention, a time series is decomposed into frequency components by use of wavelet; and a prediction value of the original time series is obtained from prediction values of the respective frequency components through inverse wavelet transformation. Thus, highly accurate prediction is enabled.

Two methods, utilizing WT and SWT, respectively, were proposed, and it was demonstrated that either method can perform prediction while preserving the chaotic characteristics of the original dynamical system.

SWT is advantageous from the viewpoint that the number of sampling points is large and that frequency components are observed while their observation times are aligned. However, redundant data are sampled excessively, with the result that two data points sampled at times close to each other strongly relate to each other, resulting in deterioration in prediction accuracy, because the prediction method erroneously induces a causal relationship between the data points. It has been shown that use of WT is desirable in order to perform prediction while avoiding auto-correlation. Moreover, WT is advantageous from the viewpoint of shorter computation time.

The prediction method of the present invention is effective in particular for prediction for a time series whose low-frequency component and high-frequency component are governed by different dynamics. Further, prediction can be performed for all types of time series through changing the prediction units according to the properties of a time series to be predicted.

That is, the time-series prediction system utilizing wavelet coefficient series according to the present invention can be applied to various types of time series, regardless of whether they are deterministic or stochastic.

The present invention is not limited to the above-described embodiment. Numerous modifications and variations of the present invention are possible in light of the spirit of the present invention, and they are not excluded from the scope of the present invention.

As have been described in detail, the present invention provides the following effects.

(A) Highly accurate prediction can be performed through the operation of decomposing a time series into frequency components by use of a wavelet coefficient series, and obtaining a prediction value of the original time series from prediction values of the respective frequency components through inverse wavelet transformation.

In particular, the method of the present invention is effective for prediction of a time series in which high-frequency chaotic noise or white noise is superimposed on deterministic low-frequency variation.

(B) Both of the methods; i.e., those using ordinary wavelet transformation and stationary wavelet transformation, can perform prediction while preserving the chaotic characteristics of the original dynamical system. Further, use of ordinary wavelet transformation is advantageous in order to avoid auto-correlation during prediction and to shorten computation time.

(C) Stationary wavelet transformation is advantageous from the viewpoint that the number of sampling points is large and that frequency components are observed while their observation times are aligned.

Accordingly, the present invention can be applied to prediction for various types of data and provides remarkable effects. Examples of such data include data associated with atmospheric phenomena and data associated with earthquakes in which various high-frequency components such as environment/thermal noise are superimposed on low-frequency hydrodynamic systems; data obtained from brain measurement in which high-frequency pulses are superimposed on low-frequency field potential; and data obtained through measurement of membrane potential of each neuron in which high-frequency channel noise is superimposed on low-frequency membrane potential variation.

INDUSTRIAL APPLICABILITY

The time series prediction method and apparatus utilizing wavelet coefficient series according to the present invention can be used effectively in particular for prediction for a time series whose low-frequency component and high-frequency component are governed by different dynamics. Further, prediction can be performed for all types of time series through changing the prediction units according to the properties of a time series to be predicted.

What is claimed is:

1. A time-series prediction method utilizing wavelet coefficient series comprising:

(a) wavelet-transforming a time series, which has a low-frequency component and a high-frequency component governed by different dynamics, by use of a wavelet transformation unit in order to decompose the time series into a plurality of time series which are band-restricted in the frequency domain;

(b) predicting values of frequency components by use of corresponding prediction units responsive to the respective time series obtained from the decomposition; and (c) obtaining a prediction value of the original time series by reconstructing the prediction values of the respective frequency components by use of an inverse wavelet transformation unit, wherein the prediction value of the original time series includes a low-frequency component and a high-frequency component governed by the different dynamics.

2. A time-series prediction method utilizing wavelet coefficient series according to claim 1, wherein ordinary wavelet transformation is used in order to wavelet-transform the time series to thereby univocally decompose the time series into a plurality of time series of the respective frequency components.

3. A time-series prediction method utilizing wavelet coefficient series according to claim 1, wherein stationary wavelet transformation is used for decomposition of the time series in order to observe the frequency components of the time series while aligning their observation times.

4. A time-series prediction method utilizing wavelet coefficient series according to claim 1, wherein a deterministic low-frequency variation is accompanied with high-frequency chaotic noise.

5. A time-series prediction method utilizing wavelet coefficient series according to claim 1, wherein a deterministic low-frequency variation is accompanied with white noise.

6. A time-series prediction apparatus utilizing wavelet coefficient series, comprising:

(a) a wavelet transformation unit for decomposing a time series, which has a low-frequency component and a high-frequency component governed by different dynamics, into a plurality of coefficient series of different frequency components;

(b) prediction units for predicting values of the respective frequency components; and (c) an inverse wavelet transformation unit for obtaining a prediction value of the original time series by reconstructing the prediction values of the respective frequency components, wherein the prediction value of the the original time series includes a low-frequency component and a high-frequency component governed by the different dynamics.

* * * * *

UNITED STATES PATENT AND TRADEMARK OFFICE
CERTIFICATE OF CORRECTION

PATENT NO. : 6,772,185 B1
DATED : August 3, 2004
INVENTOR(S) : Masuda et al.

It is certified that error appears in the above-identified patent and that said Letters Patent is hereby corrected as shown below:

Title page,
Item [75], Inventors, "Narashino" should read -- Chiba --.

Column 3,
Lines 52-58, the formula which reads: $f(t) = \sum_{R \leq j < J, k} d_j(k)\phi_{j,k}(t) + \sum_k c_R(k)\phi_{R,k}(t)$ (1)' should read $$f(t) = \sum_{R \leq j < J, k} d_j(k)\phi_{j,k}(t) + \sum_k c_R(k)\dot{\phi}_{R,k}(t) \qquad (1)'$$

Column 8,
Line 35, after "the", first instance insert -- ~ --.

Signed and Sealed this

Twenty-eighth Day of June, 2005

JON W. DUDAS
*Director of the United States Patent and Trademark Office*